(12) United States Patent
Kenny et al.

(10) Patent No.: US 8,123,563 B2
(45) Date of Patent: *Feb. 28, 2012

(54) ELECTRICAL CONNECTOR INCORPORATING PASSIVE CIRCUIT ELEMENTS

(75) Inventors: William A. Kenny, Amherst, NH (US); Thomas S. Cohen, New Boston, NH (US); Robert A. Richard, New Boston, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/004,973

(22) Filed: Jan. 12, 2011

(65) Prior Publication Data

US 2011/0256741 A1    Oct. 20, 2011

Related U.S. Application Data

(63) Continuation of application No. 12/463,118, filed on May 8, 2009, now Pat. No. 7,887,371, which is a continuation of application No. 11/902,551, filed on Sep. 24, 2007, now Pat. No. 7,540,781, which is a continuation of application No. 10/874,837, filed on Jun. 23, 2004, now Pat. No. 7,285,018.

(51) Int. Cl.
*H01R 13/66* (2006.01)

(52) U.S. Cl. ............... 439/620.22; 439/607.07

(58) Field of Classification Search ............ 439/620, 439/941, 608, 79, 108, 607, 701, 590
See application file for complete search history.

(56) References Cited

U.S. PATENT DOCUMENTS

| | | | |
|---|---|---|---|
| 3,115,379 A | 12/1963 | McKee | |
| 3,825,994 A | 7/1974 | Coleman | |
| 3,978,375 A | 8/1976 | Fukui et al. | |
| 4,464,003 A | 8/1984 | Goodman et al. | |
| 4,596,428 A | 6/1986 | Tengler | |
| 4,655,515 A | 4/1987 | Hamsher, Jr. et al. | |
| 4,675,989 A | 6/1987 | Galloway et al. | |

(Continued)

FOREIGN PATENT DOCUMENTS

EP    0212764 A2    3/1987

(Continued)

OTHER PUBLICATIONS

Author Unknown, KEMET Electronics, Ceramic Capacitors, 2003, 1 p., Kemet Electronics Corporation, http://www.kemet.com/kemet/web/homepage/kechome.nsf/vaprintpages/ceramic.

(Continued)

*Primary Examiner* — Tulsidas C Patel
*Assistant Examiner* — Phuong Nguyen
(74) *Attorney, Agent, or Firm* — Blank Rome LLP

(57) ABSTRACT

An electrical connector that electrically connects a first printed circuit board and a second printed circuit board is disclosed, where the electrical connector in the preferred embodiment includes: (a) an insulative housing; (b) a plurality of signal conductors, with at least a portion of each of the plurality of signal conductors disposed within the insulative housing; (c) each of the plurality of signal conductors having a first contact end, a second contact end and an intermediate portion therebetween; and (d) a passive circuit element electrically connected to the intermediate portion of each of the plurality of signal conductors, where the passive circuit element is housed in an insulative package and includes at least a capacitor or an inductor.

19 Claims, 6 Drawing Sheets

U.S. PATENT DOCUMENTS

| | | | |
|---|---|---|---|
| 4,705,332 A | 11/1987 | Sadigh-Behzadi |
| 4,820,169 A | 4/1989 | Weber et al. |
| 4,824,383 A | 4/1989 | Lemke |
| 4,846,727 A | 7/1989 | Glover et al. |
| 4,878,155 A | 10/1989 | Conley |
| 4,882,554 A | 11/1989 | Akaba et al. |
| 4,952,172 A | 8/1990 | Barkus et al. |
| 4,965,933 A | 10/1990 | Mraz et al. |
| 4,975,069 A | 12/1990 | Fedder et al. |
| 4,975,084 A | 12/1990 | Fedder et al. |
| 5,006,236 A | 4/1991 | Croket |
| 5,046,960 A | 9/1991 | Fedder |
| 5,104,341 A | 4/1992 | Gilissen et al. |
| 5,117,331 A | 5/1992 | Gebara |
| 5,153,540 A | 10/1992 | Gliha, Jr. |
| 5,163,540 A | 11/1992 | Mainquist et al. |
| 5,224,867 A | 7/1993 | Ohtsuki et al. |
| 5,228,824 A | 7/1993 | Satoyoshi |
| 5,228,864 A | 7/1993 | Fusselman et al. |
| 5,249,098 A | 9/1993 | Rostoker et al. |
| 5,286,212 A | 2/1994 | Broeksteeg |
| 5,287,076 A | 2/1994 | Johnescu et al. |
| 5,340,334 A | 8/1994 | Nguyen |
| 5,342,211 A | 8/1994 | Broeksteeg |
| 5,403,206 A | 4/1995 | McNamara et al. |
| 5,496,183 A | 3/1996 | Soes et al. |
| 5,525,066 A | 6/1996 | Morlion et al. |
| 5,580,283 A | 12/1996 | O'Sullivan et al. |
| 5,702,258 A | 12/1997 | Provencher et al. |
| 5,795,191 A | 8/1998 | Preputnick et al. |
| 5,860,816 A | 1/1999 | Provencher et al. |
| 5,924,899 A | 7/1999 | Paagman |
| 5,941,447 A | 8/1999 | Chu et al. |
| 5,980,321 A | 11/1999 | Cohen et al. |
| 6,019,616 A | 2/2000 | Yagi et al. |
| 6,083,047 A | 7/2000 | Paagman |
| 6,152,742 A | 11/2000 | Cohen et al. |
| 6,168,469 B1 | 1/2001 | Lu |
| 6,183,301 B1 | 2/2001 | Paagman |
| 6,325,644 B1 | 12/2001 | Lemke et al. |
| 6,375,510 B2 | 4/2002 | Asao |
| 6,379,188 B1 | 4/2002 | Cohen et al. |
| 6,409,543 B1 | 6/2002 | Astbury, Jr. et al. |
| 6,530,790 B1 | 3/2003 | McNamara et al. |
| 6,537,087 B2 | 3/2003 | McNamara et al. |
| 6,592,382 B2 | 7/2003 | Wurster |
| 6,623,280 B2 | 9/2003 | Oldenburg et al. |
| 6,652,318 B1 | 11/2003 | Winings et al. |
| 6,932,649 B1 | 8/2005 | Rothermel et al. |
| 7,285,018 B2 | 10/2007 | Kenny et al. |
| 7,540,781 B2 | 6/2009 | Kenny et al. |
| 2002/0098738 A1 | 7/2002 | Astbury et al. |
| 2003/0203683 A1 | 10/2003 | Iwasaki |
| 2004/0110421 A1 | 6/2004 | Broman et al. |
| 2005/0032430 A1 | 2/2005 | Otsu et al. |
| 2005/0121224 A1 | 6/2005 | Lien |
| 2005/0287869 A1* | 12/2005 | Kenny et al. ............... 439/620 |
| 2008/0020646 A1* | 1/2008 | Kenny et al. ............ 439/620.01 |
| 2009/0298308 A1 | 12/2009 | Kenny et al. |

FOREIGN PATENT DOCUMENTS

| | | |
|---|---|---|
| EP | 0422785 A2 | 4/1991 |
| EP | 0486298 A1 | 5/1992 |
| EP | 0560550 | 9/1993 |
| EP | 0560553 A1 | 9/1993 |
| GB | 2325354 A | 11/1998 |
| JP | 0569890 | 9/1993 |
| JP | 0613133 | 1/1994 |
| JP | 0629060 | 2/1994 |
| JP | 06054274 A | 2/1994 |
| JP | 06084557 A | 3/1994 |
| JP | 0654257 | 7/1994 |
| JP | 0654259 | 7/1994 |
| JP | 06325829 A | 11/1994 |
| JP | 07006823 A1 | 1/1995 |
| JP | 07027059 A | 1/1995 |
| JP | 0727059 | 5/1995 |
| JP | 07302649 A | 11/1995 |
| JP | 9237656 A | 9/1997 |
| JP | 10162909 A | 6/1998 |
| JP | 10270124 A | 10/1998 |
| JP | 10270133 A | 10/1998 |
| JP | 10275662 A | 10/1998 |
| JP | 10284194 A | 10/1998 |
| JP | 10302895 A | 11/1998 |
| WO | WO-8805218 A1 | 7/1988 |
| WO | WO-9638889 A1 | 12/1996 |
| WO | WO-0031832 A1 | 6/2000 |

OTHER PUBLICATIONS

Author Unknown, KEMET Electronics—Tantalum Capacitors, KEMET Electronics Corporation, 2003, 1 p.

Author Unknown, KEMET Electronics—Aluminum Capacitors, KEMET Electronics Corporation, 2003, 1 p., http://www.kemet.com/kemet/web/homepage/kechome.nsf/vaprintpages/AOCap.

Author Unknown, KEMET Polymer Tantalum Chip Capacitors, KEMET Electronics Corporation, accessed on Mar. 3, 2005, 1 p.

Author Unknown, Phoenix Contact, 5 Printed Circuit Terminal Blocks, Phoenix Terminal Blocks, Inc., 1997 or earlier, 5 pp.

Author Unknown, Phoenix Contact, Phoenix Terminal Block Technology, Phoenix Terminal Blocks, Inc., 1997 or earlier, pp. 1-36.

Author Unknown, Photographs of Berg Connector Module Bearing Code dnr2180/1.2, 1997 or earlier, 1 p. (Photographs of a module of a connector sold to Berg Electronics. This module is used in a connector similar to the connector shown in Fig. 2 of Broeksteeg (5,066,236). The contact elements are held between two pieces of insulator, which form the two sides of the module. In the photographs, the second side of the module contains grooves into which the loose contacts are placed.) Date Not Available.

Strawser, Connecterized Circuitry Utilizing Polymer Thick Film, Methode Electronics, Inc., date unknown, pp. 283-286, Chicago, IL, USA, Date Not Available.

Costlow, Thick-Film Resistors, Chip Capacitors and Diodes Built on, Electronic Engineering Times, 1988, 3 pp. No. 51, Skokie, II. USA.

* cited by examiner

ELECTRICAL CONNECTOR INCORPORATING PASSIVE CIRCUIT ELEMENTS

CROSS-REFERENCE TO RELATED APPLICATIONS

The present application is a Continuation of Ser. No. 12/463,118, now U.S. Pat. No. 7,887,371 filed May 8, 2009, which is a Continuation of Ser. No. 11/902,551, now U.S. Pat No. 7,540,781 filed Sep. 24, 2007, which is a Continuation of Ser. No. 10/874,837, now U.S. Pat. No. 7,285,018 filed Jun. 23, 2004, the entire disclosures of which are incorporated by reference herein.

BACKGROUND OF THE INVENTION

This invention relates generally to an electrical connector incorporating passive circuit elements and methods of manufacturing such an electrical connector.

Modem electronic circuitry is often built on printed circuit boards. The printed circuit boards are then interconnected to create an electronic system, such as a server or a router for a communications network. Electrical connectors are generally used to make these interconnections between the printed circuit boards. Typically, connectors are made of two pieces, with one piece on one printed circuit board and the other piece on another printed circuit board. The two pieces of the connector assembly mate to provide signal paths between the printed circuit boards.

A desirable electrical connector should generally have a combination of several properties. For example, it should provide signal paths with appropriate electrical properties such that the signals are not unduly distorted as they move between the printed circuit boards. In addition, the connector should ensure that the two pieces mate easily and reliably. Furthermore, the connector should be rugged so that it is not easily damaged by handling of the printed circuit boards. For many applications, it is also important that the connector have high density, meaning that the connector can carry a large number of electrical signals per unit length.

Examples of electrical connectors possessing these desirable properties include VHDM®, VHDM®-HSD and GbX® connectors manufactured and sold by the assignee of the present invention, Teradyne, Inc.

One of the disadvantages of present electronic systems is the need, often times, to populate the surfaces of the interconnected printed circuit boards with passive circuit elements. These passive circuit elements, such as capacitors, inductors and resistors, are necessary, for example: (i) to block or at least reduce the flow of direct current ("DC") caused by potential differences between various electronic components on the interconnected printed circuit boards; (ii) to provide desired filtering characteristics; and/or (iii) to reduce data transmission losses. However, these passive circuit elements take up precious space on the board surface (thus reducing the space available for signal paths). In addition, where these passive circuit elements on the board surface are connected to conductive vias, there could be undesirable signal reflections at certain frequencies due to impedance discontinuity and resonant stub effects.

What is desired, therefore, is an electrical connector and methods of manufacturing such an electrical connector that generally possesses the desirable properties of the existing connectors described above, but also provides passive circuit elements in the connector to deliver the desired qualities provided by the passive circuit elements described above. And it is further desired that such an electrical connector provide the passive circuit elements cost effectively.

SUMMARY OF THE INVENTION

The objects of the invention are achieved in the preferred embodiment by an electrical connector that electrically connects a first printed circuit board and a second printed circuit board, where the electrical connector includes: (a) an insulative housing; (b) a plurality of signal conductors, with at least a portion of each of the plurality of signal conductors disposed within the insulative housing; (c) each of the plurality of signal conductors having a first contact end, a second contact end and an intermediate portion therebetween; and (d) a passive circuit element electrically connected to the intermediate portion of each of the plurality of signal conductors, where the passive circuit element is housed in an insulative package and includes at least a capacitor or an inductor.

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENT

Figure 1:
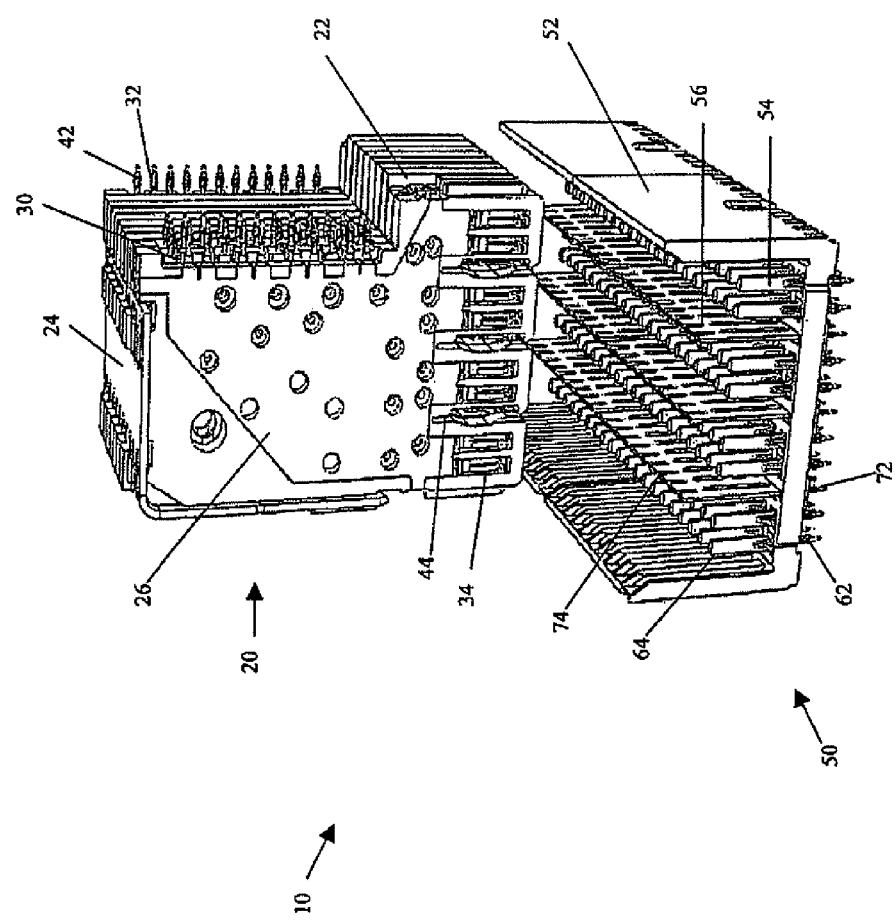
FIG. 1 shows a perspective view of a prior art electrical connector assembly illustrated as FIG. 1 in U.S. Pat. No. 6,409,543, where the electrical connector assembly includes a daughtercard connector and a backplane connector.

FIG. 1 shows a perspective view of a prior art electrical connector assembly 10 illustrated as FIG. 1 in U.S. Pat. No. 6,409,543. The '543 patent, which is directed to the GbX® connector, is assigned to the assignee of the present invention and is incorporated by reference herein. The electrical connector assembly 10 includes a daughtercard connector 20 that is connectable to a first printed circuit board (not shown) and a backplane connector 50 that is connectable to a second printed circuit board (not shown). The daughtercard connector 20 has a plurality of modules or wafers 22 which are preferably held together by a stiffener 24.

Each wafer 22 includes a plurality of signal conductors 30, a shield plate (not visible in FIG. 1), and a dielectric housing 26 that is formed around at least a portion of each of the plurality of signal conductors 30 and the shield plate. Each of the signal conductors 30 has a first contact end 32 connectable to the first printed circuit board and a second contact end 34 mateable to the backplane connector 50. Each shield plate has a first contact end 42 connectable to the first printed circuit board and a second contact end 44 mateable to the backplane connector 50.

The backplane connector 50 includes an insulative housing 52 and a plurality of signal conductors 54 held by the insulative housing 52. The plurality of signal conductors 30, 54 are arranged in an array of differential signal pairs. The backplane connector 50 also includes a plurality of shield plates 56 that are located between rows of differential signal pairs. Each of the signal conductors 54 has a first contact end 62 connectable to the second printed circuit board and a second contact end 64 mateable to the second contact end 34 of the corresponding signal conductor 30 of the daughtercard connector 20. Each shield plate 56 has a first contact end 72 connectable to the second printed circuit board and a second contact end 74 mateable to the second contact end 44 of the corresponding shield plate of the daughtercard connector 20.

As discussed in the Background Of The Invention section, the electrical connector assembly 10 of FIG. 1 does not have passive circuit elements that would provide desirable characteristics, such as DC flow minimization, desired filtering characteristics or data transmission loss reduction.

Figure 2:
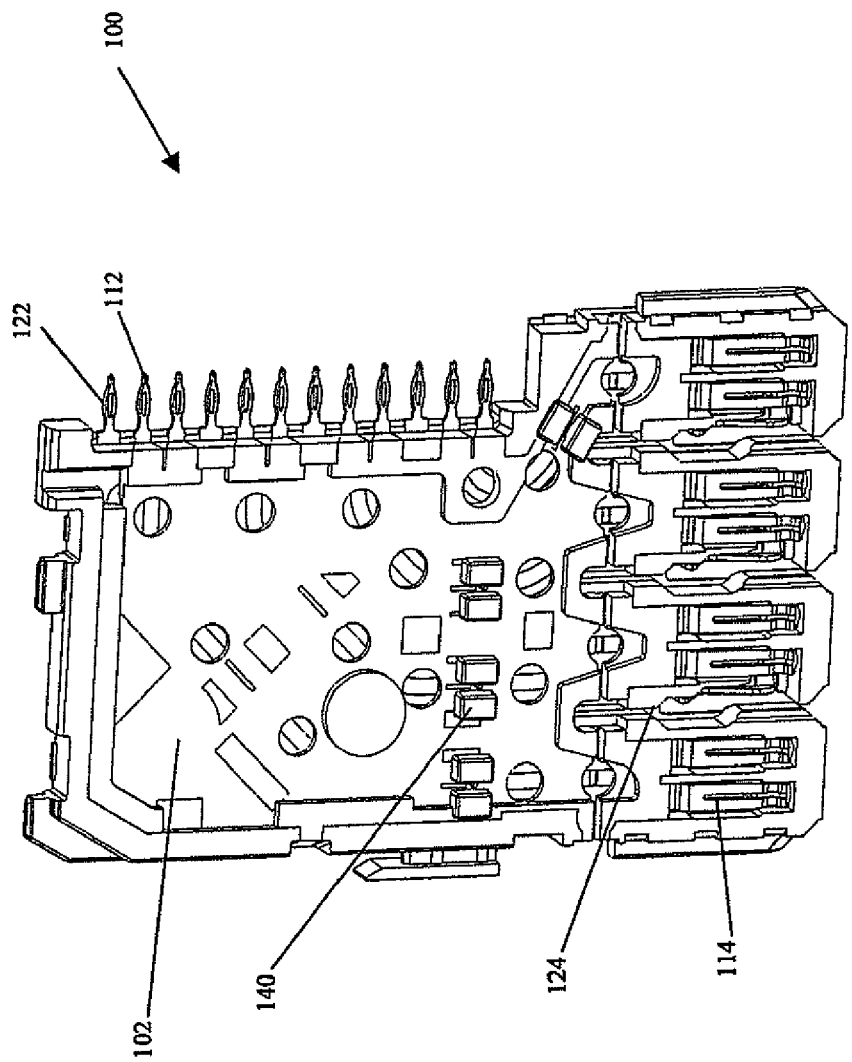
FIG. 2 shows a perspective view of a wafer of a daughtercard connector in accordance with the preferred embodiment of the present invention.
Figure 3:
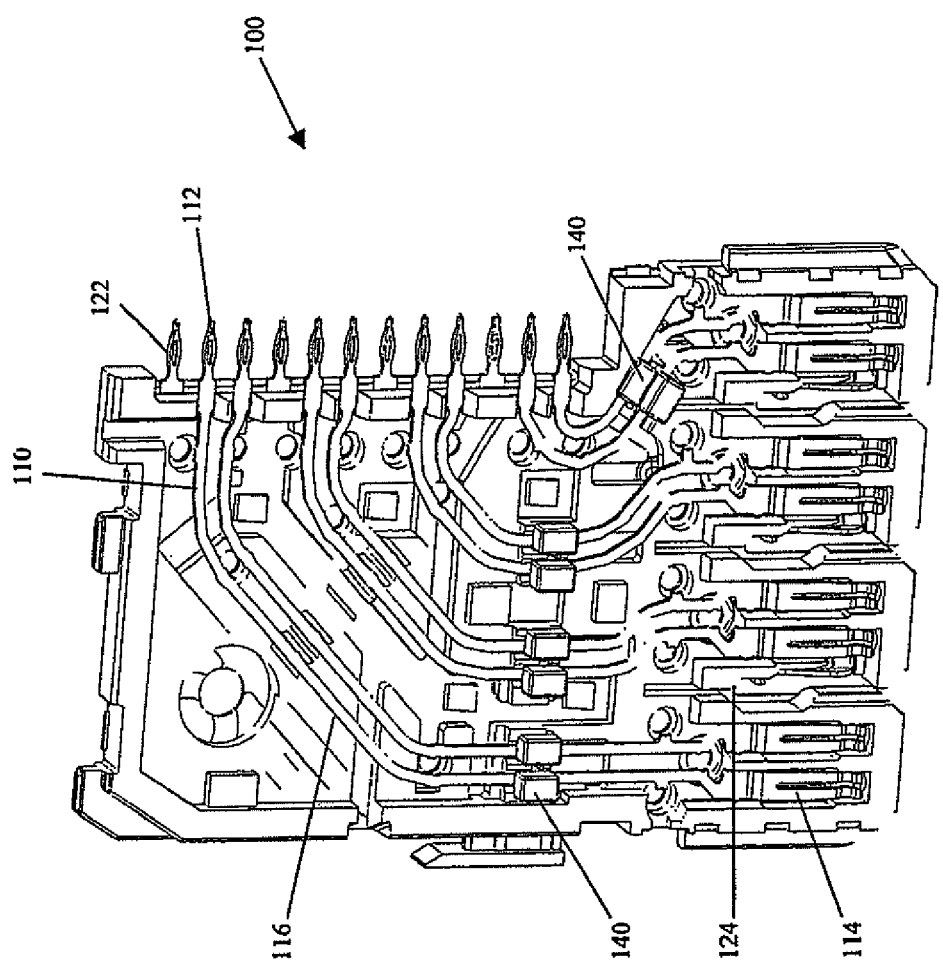
FIG. 3 shows a perspective view of the wafer of FIG. 2, with a portion of an insulative housing removed from the drawing to better illustrate attachment of passive circuit elements to signal conductors of the wafer.

Referring now to FIG. 2, there is shown a wafer 100 of a daughtercard connector (not shown) in accordance with the preferred embodiment of the present invention. The wafer 100 may be one of a plurality of such wafers that are held together by a stiffener, such as the stiffener 24 of FIG. 1. The wafer 100 includes a plurality of signal conductors 110 and an insulative housing 102. The signal conductors 110 are more clearly shown in FIG. 3, which illustrates the wafer 100 of FIG. 2 with a portion of the insulative housing 102 removed from the drawing. Note that the signal conductors 110 are arranged as differential signal pairs, with a first distance between signal conductors of a differential pair smaller than a second distance between signal conductors of adjacent differential pairs. However, it should be apparent to one of ordinary skill in the art reading this specification that the present invention and its concepts can be applied equally as well to single-ended signal connectors.

Each signal conductor 110 has a first contact end 112, a second contact end 114 and an intermediate portion 116 therebetween. The intermediate portion 116 of the signal conductor 110 is disposed within the insulative housing 102. Preferably, the wafer 100 also includes a ground conductor member or a shield plate having a first contact end 122 and a second contact end 124. The configuration of the shield plate may be similar to the shield plate of FIG. 1. The first contact ends 112, 122, which are illustrated as press-fit "eye of the needle" contact ends, are connectable to a first printed circuit board (not shown). The second contact ends 114, 124 are connectable to a mating connector (not shown), such as the backplane connector 50 of FIG. 1.

Attached to the intermediate portion 116 of each signal conductor 110 is a passive circuit element 140. Preferably, the passive circuit element 140 includes at least a capacitor or an inductor housed in an insulative package and is a commercially available off-the-shelf component. For example, if the passive circuit element 140 is desired to function as a direct current blocking circuit, then may be one of the ceramic or tantalum chip capacitors that are sold by KEMET Electronics Corporation-of-Greenville, South Carolina can be utilized. The technical information for these ceramic or tantalum chip capacitors are available from KEMET (www.kemet.com) and are incorporated by reference herein. If the passive circuit element 140 is desired to function as a high frequency passive equalization circuit, then one of the resistor/inductor/capacitor packages that are sold by Maxim Integrated Products, Inc. of Sunnyvale, Calif. can be utilized. The technical information for these packages are available from Maxim (www.maxim-ic.com) and are incorporated by reference herein. It should be noted that while the preferred embodiment is directed to a two-piece (daughtercard connector and backplane connector), shielded, differential pair connector assembly, the concepts of the invention are applicable to a one-piece connector, an unshielded connector, a single-ended connector or any other type of electrical connector.

Figure 6:
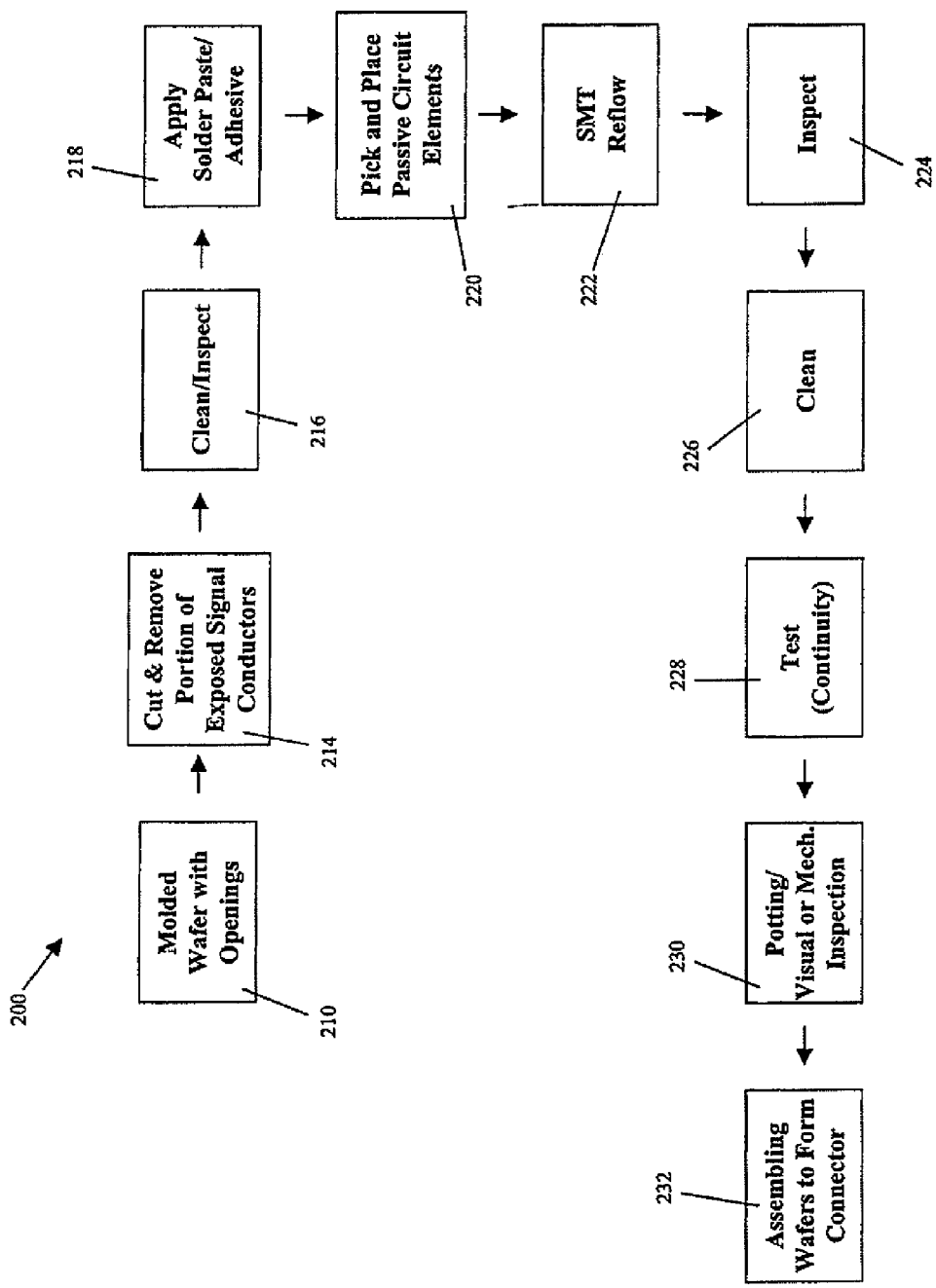
FIG. 6 shows a flowchart of a preferred manufacturing process for the connector in accordance with the present invention.

Referring now to FIG. 6, there is shown a flowchart 200 of a preferred manufacturing process for a connector in accordance with the present invention. This flowchart 200 illustrates the process steps for modifying and adapting an existing connector, such as the daughtercard connector 20 of FIG. 1, to provide the desirable passive circuit elements. It should be apparent to one of ordinary skill in the art that as the various process steps of the flowchart 200 are described, some of the steps need not be included in order to manufacture a connector in accordance with the present invention. Furthermore, the sequence of some of the steps may be varied.

Step 210 describes providing a wafer, such as a wafer 22 of FIG. 1, where during the molding of the insulative housing around the plurality of signal conductors, openings are defined through which an exposed area of each of the signal conductors is accessible. Preferably, the openings are provided adjacent the intermediate portions 116 of the signal conductors 110. Note that the plurality of signal conductors are preferably stamped from a lead frame, as is known in the art. Typically, the signal conductors 110 are made of a solder wettable material, such as beryllium-copper or the like, and intermediate portions 116 of the signal conductors 110 may be coated with nickel or other non-solder wetting material. In this case, the exposed area of the signal conductors is provided with solder wettable material, such as tin-lead coating.

Figure 4:
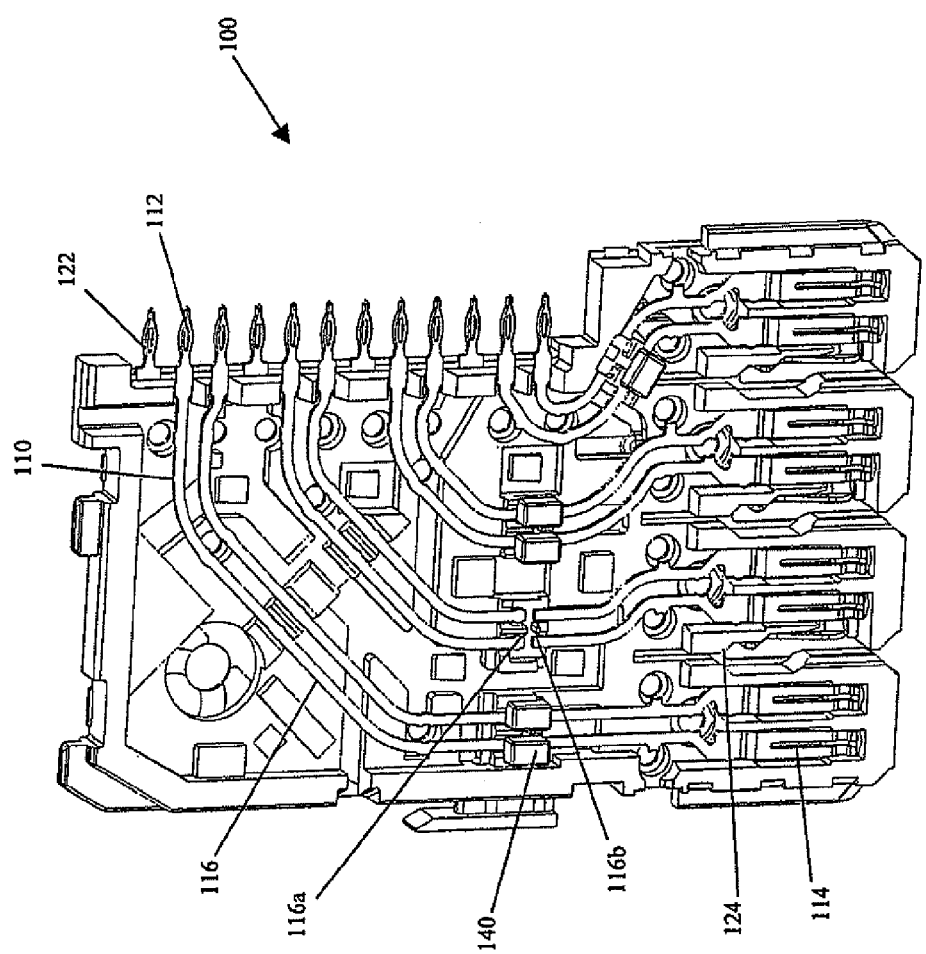
FIG. 4 shows a perspective view of the wafer of FIG. 3, with some of the passive circuit elements removed from the drawing to better illustrate portions of the signal conductors to which the passive circuit elements are attached.

Step 214 describes cutting and removing a portion of the exposed area of the signal conductors such that only a portion of the exposed area remains. FIG. 4, which is a perspective view of the wafer 100 of FIG. 3 with some of the passive circuit elements 140 removed from the drawing, shows the remaining portion 116a, 116b of the exposed area of the signal conductors 110. Step 216 describes cleaning and inspecting the signal conductors 110 after the cutting and removing step 214. This step can be performed manually or automatically, and can be bypassed if desired.

Step 218 describes applying solder paste or conductive adhesive to the remaining. portion 116a, 116b of the exposed area of the signal conductors 110. Step 220 then describes picking and placing passive circuit elements 140 onto the remaining portions 116a, 116b of the exposed area of the signal conductors 110. Note that the openings in the insulative housing described in step 210 are sized to receive the passive circuit elements 140. And step 222 describes conventional SMT reflow to securely attach the passive circuit elements 140 to the remaining portions 116a, 116b of the exposed area of the signal conductors 110. While the preferred method of step 218 is to apply the solder paste or conductive adhesive to the remaining portion 116a, 116b of the exposed area of the signal conductors 110, it should be apparent to one of ordinary skill in the art that the solder paste/conductive adhesive may instead be applied to the passive circuit elements 140 or to both the remaining portion 116a, 116b of the exposed area of the signal conductors 110 and the passive circuit elements 140 as desired.

Steps 224 and 226 respectively describe. inspecting-and-cleaning the attachment area around the passive circuit elements 140 and the remaining portions 116a, 116b of the exposed area of the signal conductors 110. Steps 228 and 230 respectively describe testing for electrical continuity across the attachment area and potting/visual or mechanical inspection as required. Finally, step 232 describes assembling a plurality of wafers 100 to form a connector in accordance with the preferred embodiment of the present invention.

While the flowchart 200 illustrates cutting and removing a portion of the exposed area of the signal conductors 110 (step 214) after the insulative housing has been molded around the plurality of signal conductors, it is certainly possible, and in some cases even preferable, to cut and remove the portion of the exposed area of the signal conductors before the insulative housing has been molded around the plurality of signal conductors. The molded insulative housing will define openings through which the remaining portion of the exposed area of the signal conductors will be accessible.

In an alternative manufacturing-process (not shown) for a connector in accordance with the present invention, a passive circuit element (preferably a capacitive element) may be provided as follows: (i) providing a first lead frame which includes a plurality of first signal conductors, with each of the plurality of first signal conductors having a first contact end and an intermediate portion; (ii) providing a second lead frame which includes a plurality of second signal conductors, with each of the plurality of second signal conductors having a second contact end and an intermediate portion; (iii) positioning the plurality of first signal conductors and the plurality of second signal conductors adjacent one another such that for each first signal conductor there is a corresponding second signal conductor adjacent thereto; (iv) attaching at least a segment of the intermediate portion of each first signal conductor to at least a segment of the intermediate portion of the corresponding second-signal conductor with a dielectric material provided therebetween so as to provide a capacitive element; and (v) providing an insulative housing around at least a portion of each of the plurality of first and second signal conductors. In this process, the attached intermediate portions of the first signal conductor and the second signal conductor serve as capacitive plates to provide the desired capacitive characteristics. Other applicable steps from FIG. 6 can then be utilized as needed.

Figure 5:
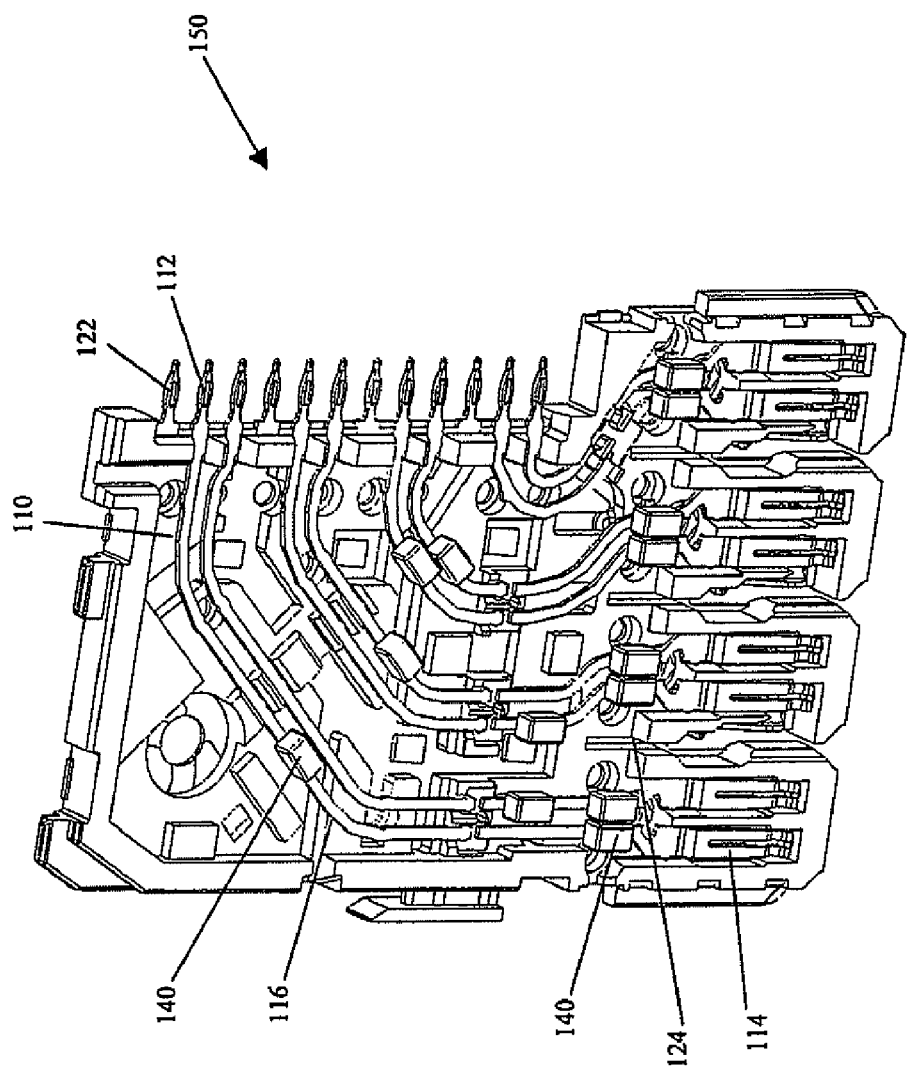
FIG. 5 shows a perspective view of a wafer of a daughtercard connector in accordance with another embodiment of the present invention.

Referring now to FIG. 5, there is shown a perspective view of a wafer 150 of a daughtercard connector (not shown) in accordance with another embodiment of the present invention. The wafer 150 may be one of a plurality of such wafers that are held together by a stiffener, such as the stiffener 24 of FIG. 1. The wafer 150 of FIG. 5 is similar to the wafer 100 of FIG. 2, with the substantive difference being the presence of additional passive circuit elements 140 along the intermediate portions 116 of the signal conductors 110. Note that in the wafer 150 illustrated in FIG. 5, all but two signal conductors that are shortest in length are provided with two passive circuit elements 140 each. In some simulations, it has been shown that having additional passive circuit elements 140 provides better desired qualities, such as high frequency passive equalization. It should be noted that the desirable number of passive circuit elements 140 is not limited to one or two per signal conductor, but rather depends on various other factors, including the structure and electrical characteristics of the connector.

Having described the preferred embodiment of the invention, it will now become apparent to one of ordinary skill in the art that other embodiments incorporating their concepts may be used.

It is felt therefore that these embodiments should not be limited to disclosed embodiments but rather should-be-limited only-by the spirit and scope of the appended claims.

All publications and references cited herein are expressly incorporated herein by reference in their entirety.

What is claimed is:

1. An electrical connector that electrically connects a first printed circuit board and a second printed circuit board, the electrical connector comprising:
    a backplane connector capable of connecting to the first printed circuit board;
    a daughtercard connector comprising at least one wafer having a plurality of signal conductors, each signal conductor having a first contact end capable of connecting to the second printed circuit board, a second contact end mateable to the backplane connector, and an intermediate portion between the first and second contact ends;
    an insulative housing disposed at least a portion of each of the plurality of signal conductors,
    a passive circuit element attached to the intermediate portion of at least one of the plurality of signal conductors,
    wherein the plurality of signal conductors are arranged as differential signal pairs, with a first distance between signal conductors of a differential pair being smaller than a second distance between signal conductors of adjacent differential pairs,
    wherein the insulative housing of each wafer includes at least one opening, and
    wherein each opening is sized to receive a passive circuit element.

2. The electrical connector of claim 1 comprising a plurality of passive circuit elements, wherein attached to the intermediate portion of each of the plurality of signal conductors is a corresponding one of the plurality of passive circuit elements.

3. The electrical connector of claim 1 comprising a plurality of passive circuit elements, wherein attached to the intermediate portion of at least one of the plurality of signal conductors are at least two passive circuit elements.

4. The electrical connector of claim 1, wherein each passive circuit element includes a capacitor or an inductor.

5. The electrical connector of claim 1, wherein each wafer includes a shield plate having a first contact end and a second contact end, the second contact end being mateable to the backplane connector.

6. The electrical connector of claim 1, wherein each opening is formed such that an exposed area of each of the signal conductors is accessible through at least one of each of the openings.

7. The electrical connector of claim 1, wherein the electrical connector includes a plurality of wafers.

8. The electrical connector of claim 7, wherein the plurality of wafers is held together by a stiffener.

9. The electrical connector of claim 1, wherein the backplane connector includes an insulative backplane housing and a plurality of backplane signal conductors held by the insulative backplane housing, each of the plurality of backplane signal conductors having a first contact end and a second contact end, the second contact end of each backplane signal conductor being mateable with the second contact end of one of the plurality of signal conductors disposed on each wafer.

10. The electrical connector of claim 9, wherein the plurality of backplane signal conductors are arranged in rows of differential signal pairs.

11. The electrical connector of claim 10, wherein the backplane connector includes a plurality of backplane shield plates, each backplane shield plate being disposed between rows of differential signal pairs, and each backplane shield plate having a first contact end and a second contact end, and wherein each wafer includes a shield plate having a first contact end and a second contact end, the second contact end of each backplane shield plate being mateable to the second contact end of the shield plate on one of the wafers.

12. An electrical connector that electrically connects a first printed circuit board and a second printed circuit board, the electrical connector comprising:
- a backplane connector capable of connecting to the first printed circuit board;
- a daughtercard connector comprising at least one wafer having a plurality of signal conductors disposed in a plane, each signal conductor having a first contact end capable of connecting to the second printed circuit board, a second contact end mateable to the backplane connector, and an intermediate portion between the first and second contact ends, wherein at least one intermediate portion has a gap therein;
- an insulative housing having a first portion disposed over the plurality of signal conductors, the insulative housing being substantially planar and having openings through which each of the gaps are accessible; and
- a passive circuit element disposed at each of the gaps,
- wherein the plurality of signal conductors are arranged as differential pairs, with a first distance between signal conductors of a differential pair being smaller than a second distance between signal conductors of adjacent pairs.

13. The electrical connector of claim 12, wherein the insulative housing has a second portion disposed beneath the plurality of signal conductors.

14. The electrical connector of claim 12, wherein each intermediate portion has a gap therein.

15. The electrical connector of claim 12, further comprising a plurality of passive circuit elements disposed at least one of the gaps.

16. The electrical connector of claim 12, wherein each passive circuit element includes a capacitor or an inductor.

17. The electrical connector of claim 12, further comprising a shield plate, wherein the shield plate is substantially planar and substantially parallel to the plane of signal conductors.

18. The electrical connector of claim 17, wherein the shield plate has a plurality of first contact ends capable of connecting to the first printed circuit board; and a plurality of second contact ends capable of connecting to the second printed circuit board.

19. The electrical connector of claim 18, wherein the first contact ends of the signal conductors and the first contact ends of the shield plate are press-fit contact ends.

* * * * *